US00RE48110E

(19) United States
(12) Reissued Patent
Yamamoto et al.

(10) Patent Number: US RE48,110 E
(45) Date of Reissued Patent: Jul. 21, 2020

(54) STORAGE MEDIUM AND SEMICONDUCTOR PACKAGE

(71) Applicant: Toshiba Memory Corporation, Tokyo (JP)

(72) Inventors: Tetsuya Yamamoto, Kanagawa (JP); Yasuo Takemoto, Kanagawa (JP)

(73) Assignee: Toshiba Memory Corporation, Tokyo (JP)

(21) Appl. No.: 14/181,194

(22) Filed: Feb. 14, 2014

Related U.S. Patent Documents

Reissue of:
(64) Patent No.: 8,115,290
Issued: Feb. 14, 2012
Appl. No.: 12/393,655
Filed: Feb. 26, 2009

(30) Foreign Application Priority Data

Feb. 29, 2008 (JP) ..... 2008-049823

(51) Int. Cl.

| | |
|---|---|
| ***H01L 23/02*** | (2006.01) |
| ***H01L 23/34*** | (2006.01) |
| ***H01L 23/48*** | (2006.01) |
| ***H01L 23/52*** | (2006.01) |
| ***H01L 29/40*** | (2006.01) |
| ***H01L 23/28*** | (2006.01) |
| ***H01L 25/065*** | (2006.01) |
| ***H01L 23/50*** | (2006.01) |

(52) U.S. Cl.
CPC ..... *H01L 25/065* (2013.01); *H01L 23/02* (2013.01); *H01L 23/28* (2013.01); *H01L 23/34* (2013.01); *H01L 23/48* (2013.01); *H01L 23/50* (2013.01); *H01L 23/52* (2013.01); *H01L 29/40* (2013.01)

(58) Field of Classification Search
CPC ..... H01L 23/50; H01L 23/562; H01L 24/33; H01L 24/49; H01L 24/48
USPC ..... 257/738, 777
See application file for complete search history.

(56) References Cited

U.S. PATENT DOCUMENTS 5,285,352 A * 2/1994 Pastore et al. ..... 361/707
5,815,426 A * 9/1998 Jigour ..... G06F 13/409 365/244
6,091,137 A * 7/2000 Fukuda ..... 257/679
6,104,093 A * 8/2000 Caletka ..... H01L 23/3128 257/706

(Continued)

FOREIGN PATENT DOCUMENTS

JP 3012948 4/1995
JP 11-176890 7/1999

(Continued)

OTHER PUBLICATIONS

U.S. Appl. No. 12/238,983, filed Sep. 26, 2008, Taku Nishiyama, et al.

*Primary Examiner* — Leonardo Andujar
(74) *Attorney, Agent, or Firm* — Oblon, McClelland, Maier & Neustadt, L.L.P.

(57) ABSTRACT

A semiconductor package includes a semiconductor chip formed with a non-volatile semiconductor memory, a resin encapsulation that encapsulates the semiconductor chip, electrodes in a lattice (solder balls) formed and arrayed in a lattice on a bottom surface of the resin encapsulation. The solder balls include a signal electrode formed within the central region of the array and a dummy electrode formed outside the signal electrode.

70 Claims, 9 Drawing Sheets

(56) References Cited

U.S. PATENT DOCUMENTS

| | | | | |
|---|---|---|---|---|
| 6,105,144 | A * | 8/2000 | Wu | G06F 13/4243 713/401 |
| 6,285,086 | B1 * | 9/2001 | Sota et al. | 257/786 |
| 6,303,878 | B1 * | 10/2001 | Kondo | H01L 23/49816 174/260 |
| 6,316,838 | B1 * | 11/2001 | Ozawa et al. | 257/778 |
| 6,476,503 | B1 * | 11/2002 | Imamura et al. | 257/780 |
| 6,798,049 | B1 * | 9/2004 | Shin | H01L 23/13 257/676 |
| 6,857,470 | B2 * | 2/2005 | Park et al. | 165/185 |
| 6,900,528 | B2 * | 5/2005 | Mess et al. | 257/686 |
| 7,291,929 | B2 * | 11/2007 | Tanaka et al. | 257/784 |
| 7,317,247 | B2 * | 1/2008 | Lee et al. | 257/706 |
| 7,622,684 | B2 * | 11/2009 | Takano et al. | 174/527 |
| 7,674,987 | B2 * | 3/2010 | Kodama et al. | 174/260 |
| 7,795,743 | B2 * | 9/2010 | Kim et al. | 257/786 |
| 7,880,309 | B2 * | 2/2011 | Pilla | 257/777 |
| 2002/0070400 | A1 * | 6/2002 | Shibuya et al. | 257/296 |
| 2004/0164428 | A1 * | 8/2004 | Takahashi et al. | 257/780 |
| 2004/0183205 | A1 * | 9/2004 | Yamaguchi | 257/774 |
| 2004/0196635 | A1 * | 10/2004 | Park et al. | 361/707 |
| 2005/0230824 | A1 * | 10/2005 | Watanabe et al. | 257/735 |
| 2005/0243459 | A1 * | 11/2005 | Kimura | G11B 25/043 360/97.11 |
| 2006/0131430 | A1 * | 6/2006 | Ito | 235/492 |
| 2006/0231952 | A1 | 10/2006 | Kim et al. | 257/738 |
| 2006/0281297 | A1 * | 12/2006 | Ogawa et al. | 438/622 |
| 2007/0035019 | A1 * | 2/2007 | Carney et al. | 257/734 |
| 2007/0178623 | A1 * | 8/2007 | Shimokawa et al. | 438/106 |
| 2008/0012148 | A1 * | 1/2008 | Takahashi | 257/778 |
| 2008/0029903 | A1 * | 2/2008 | Lin | 257/777 |
| 2008/0032450 | A1 * | 2/2008 | Huang | 438/108 |
| 2008/0042259 | A1 * | 2/2008 | Yamaguchi | 257/700 |
| 2008/0316696 | A1 | 12/2008 | Nishiyama et al. | 361/679.31 |
| 2010/0148302 | A1 * | 6/2010 | Yamamoto et al. | 257/531 |

FOREIGN PATENT DOCUMENTS

| | | |
|---|---|---|
| JP | 2001-94001 | 4/2001 |
| JP | 2003-289105 | 10/2003 |
| JP | 2006-294687 | 10/2006 |
| JP | 2007-36035 | 2/2007 |
| JP | 2007-207397 | 8/2007 |
| JP | 2007-220954 | 8/2007 |
| JP | 2009-065066 | 3/2009 |
| JP | 2009065066 A * | 3/2009 |

* cited by examiner

STORAGE MEDIUM AND SEMICONDUCTOR PACKAGE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application is based upon and claims the benefit of priority from the prior Japanese Patent Application No. 2008-049823, filed on Feb. 29, 2008; the entire contents of which are incorporated herein by reference.

BACKGROUND OF THE INVENTION

1. Field of the Invention

The present invention relates to a storage medium and a semiconductor package.

2. Description of the Related Art

In a storage medium that includes a semiconductor package and a mounting substrate on which the semiconductor package is mounted, it has been desired to further downsize the storage medium with a larger capacity. Conventionally, as one of the methods for realizing downsizing storage mediums with a larger capacity, there has been proposed the use of a semiconductor package of various types such as a ball grid array (BGA) and a land grid array (LGA).

In a BGA semiconductor package or LGA semiconductor package, unlike a semiconductor package of a thin small outline package (TSOP), electrodes are arranged on the bottom surface of a resin encapsulation, and thus the electrodes (leads) do not extend from the periphery (end surface) of the resin encapsulation. At the time of mounting on the mounting substrate, the resin encapsulations of the adjacent packages can be placed close to each other, and this can achieve a high density of a semiconductor chip and downsizing of a storage medium. Conventionally, to achieve a higher density of the semiconductor chip, there has been also proposed a semiconductor package of a multi chip package (MCP) in which a plurality of semiconductor chips are stacked and encapsulated in a single package.

In such a semiconductor package, while it is possible to achieve a high density thereof and downsizing of the storage medium, a large number of electrodes are placed on the bottom surface of the resin encapsulation. The large number of electrodes formed on the bottom surface of the resin encapsulation are generally formed in a rectangular grid shape. However, to improve the reliability, the electrodes formed at the corners in the array are not used for transferring and receiving a signal. This is because cracks can be easily generated at the corners of the package (for example, see Japanese Patent Application Laid-open No. 2007-207397).

However, a storage medium on which such a semiconductor package is mounted has been desired to have a higher reliability. Recently, a storage medium in which a non-volatile semiconductor memory is incorporated has been used in various areas ranging from large-scale computers to personal computers, household appliances, cellular phones and the like. Further, such a storage medium is even considered as an alternative to a hard disk drive (HDD).

Therefore, a more reliable storage medium with excellent impact resistance and temperature cycle resistance has been desired.

BRIEF SUMMARY OF THE INVENTION

A storage medium according to an embodiment of the present invention comprises: a semiconductor package having a semiconductor chip, a resin that encapsulates the semiconductor chip, and a plurality of electrodes arrayed on a bottom surface of the resin; and a substrate including a conductor that joins the electrodes, and having the semiconductor package mounted thereon, wherein the electrodes include a signal electrode formed within a central region of the array, and a dummy electrode formed outside of the signal electrode.

A semiconductor package according to an embodiment of the present invention comprises: a semiconductor chip; a wiring substrate having the semiconductor chip mounted on a first surface; and a plurality of projection electrodes formed on a second surface opposite to the first surface of the wiring substrate, wherein a bonding pad to which a bonding wire extending from the semiconductor chip is connected is formed at an edge of the first surface on the wiring substrate, and a plurality of projection-electrode forming pads for forming the projection electrodes are arrayed and formed in a lattice on the second surface, and the projection-electrode forming pads for a power supply line formed within a central region of the array and a pattern extending to a second surface side on the wiring substrate via a through hole from the bonding pad are connected via the projection-electrode forming pads for a dummy electrode formed within an outer region of the array.

A semiconductor package according to an embodiment of the present invention comprises: a semiconductor chip; a wiring substrate having the semiconductor chip mounted on a first surface; and a plurality of projection electrodes formed on a second surface opposite to the first surface of the wiring substrate, wherein a bonding pad to which a bonding wire extending from the semiconductor chip is connected is formed at an edge of the first surface on the wiring substrate, and a plurality of projection-electrode forming pads for forming the projection electrodes are formed on the second surface, and a pattern extending to the second surface of the wiring substrate via a through hole from the bonding pad is connected to the projection-electrode forming pads.

DETAILED DESCRIPTION OF THE EMBODIMENTS

Exemplary embodiments of a storage medium and a semiconductor package according to the present invention will be explained below in detail with reference to the accompanying drawings. The present invention is not limited to the embodiments.

Figure 1:
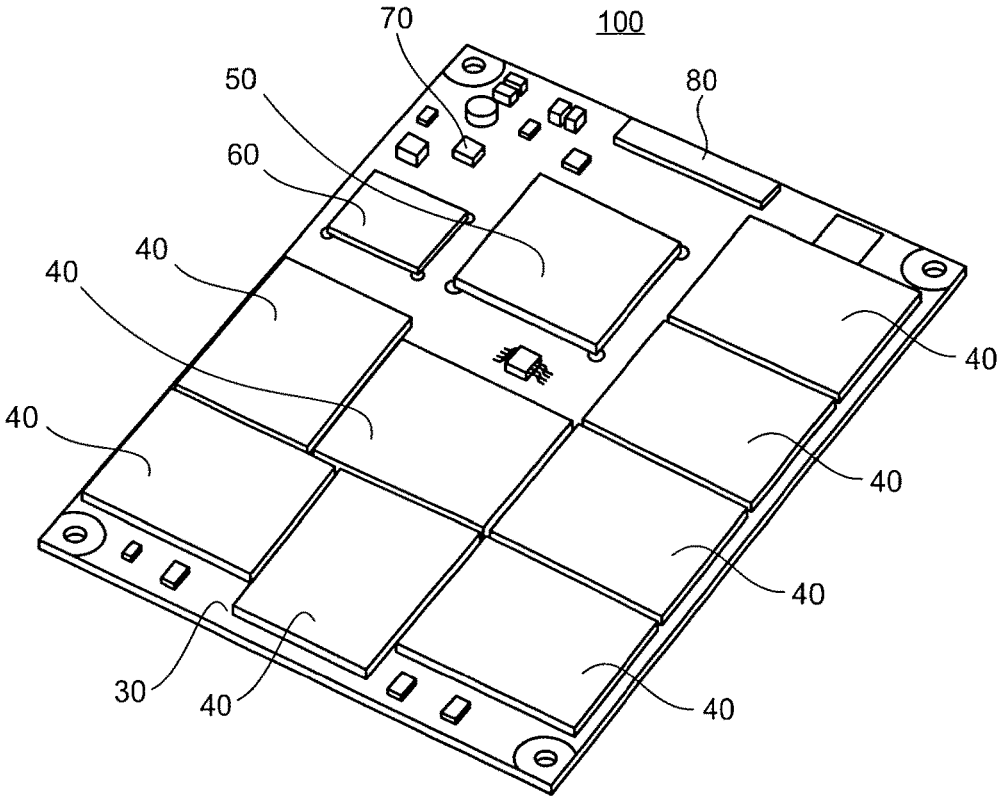
FIG. 1 is a perspective view of a storage medium according to a first embodiment of the present invention.

FIG. 1 is a perspective view of a storage medium according to a first embodiment of the present invention. A solid state drive (SSD) 100, which is a storage medium, is a module configured such that a plurality of semiconductor packages are mounted on a mounting substrate (motherboard) 30, which is a small rectangular substrate of 3 millimeters (mm) in thickness. The semiconductor packages are BGA semiconductor packages in which each semiconductor chip is encapsulated with a resin. Each semiconductor package includes eight semiconductor packages 40 each incorporating a NAND flash memory as a non-volatile memory, a semiconductor package 50 incorporating a drive control circuit as a controller, a semiconductor package 60 incorporating a DRAM as a volatile memory, and a semiconductor package 70 incorporating a power supply circuit. Furthermore, a connector 80 is arranged on one of the short sides of the outer periphery of the mounting substrate 30.

The outer dimension of the mounting substrate 30 is substantially the same in size as that of a 1.8-inch HDD, according to the HDD standard. The connector 80 is also fabricated based on the HDD standard, and a high-speed serial ATA that is the same as the HDD is adopted for an interface. The semiconductor package 40 incorporating the NAND flash memory is 14×18 mm in outer dimension, and is a maximum of 1.46 millimeters in height from the mounting substrate 30. This height is lower than 2.35 millimeters, that is, a height obtained by superposing two TSOP semiconductor packages incorporating four semiconductor chips (that is, a height when semiconductor chips having thereon with eight chips are realized by the TSOP semiconductor package) (according to the current limitation, only up to four semiconductor chips can be encapsulated with a resin in the TSOP semiconductor package).

Figure 2:
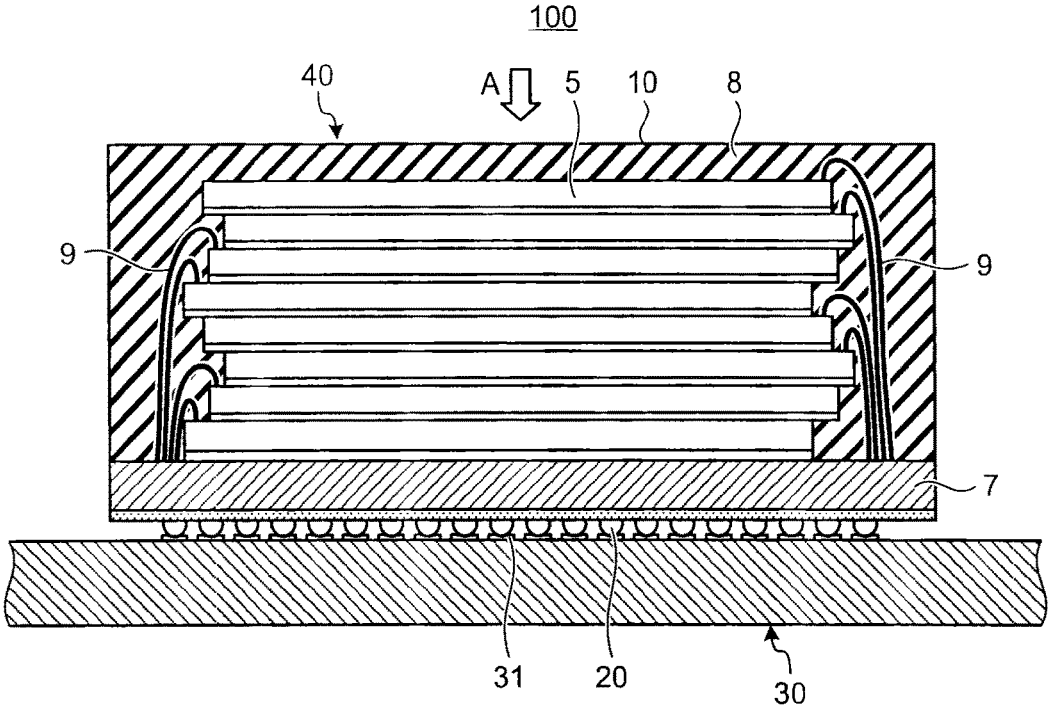
FIG. 2 is a cross-sectional view of a part having a semiconductor package of an SSD mounted thereon.

FIG. 2 is a cross-sectional view of a part having the semiconductor package 40 incorporating the NAND flash memory of the SSD 100 shown in FIG. 1 mounted thereon. The semiconductor package 40 is configured by eight semiconductor chips 5 each formed with a NAND flash memory, a resin encapsulation 10, in an approximate flat-plate shape, that encapsulates the semiconductor chips 5 with a resin, and solder balls 20, as lattice electrodes, formed to be arrayed in a lattice (grid shape) on the bottom surface of the resin encapsulation 10. A multiple-valued technology for recording any one of values "00", "01", "10", and "11" for each memory cell is adopted in the NAND flash memory, and a capacity per device is further improved as compared to that of a double-valued technology. A NAND flash memory that can store up to 2 gigabytes is formed in each semiconductor chip 5, and 128 gigabytes can be stored in the entire SSD 100. The number of semiconductor chips is not limited to eight, and is changed appropriately depending on a capacity of the storage medium or the like.

The resin encapsulation 10 includes a wiring substrate (interposer) 7, an encapsulation resin 8, and a bonding wire 9. On the wiring substrate 7, the semiconductor chips 5 are mounted on a first surface (top surface), and the solder balls 20 are formed on a second surface (reverse surface) that faces the first surface. The encapsulation resin 8 encapsulates the eight semiconductor chips 5 with a resin on the first surface side of the wiring substrate 7. The bonding wire 9 electrically connects the semiconductor chip 5 and the wiring substrate 7. The solder balls 20 are soldered and joined to a joining conductor 31 that is formed as a wiring pattern on the mounting substrate 30.

Figure 3:
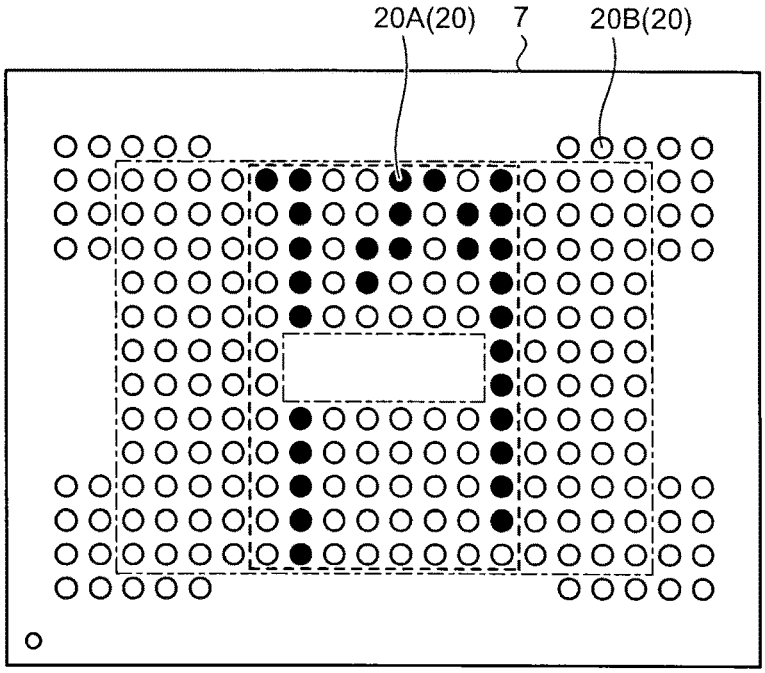
FIG. 3 depicts an arrangement of signal electrodes and dummy electrodes of a storage medium according to the first embodiment.

FIG. 3 depicts how the solder balls 20 are arrayed to form a line lengthwise and crosswise, and also depicts the semiconductor package 40 as seen from the second surface side of the wiring substrate 7. The solder balls 20 are formed to be aligned lengthwise and crosswise on the second surface of the wiring substrate 7. In the array of the solder balls 20, there is a basic part (part surrounded by a long dash short dash line in FIG. 3) that is so arrayed in an approximate rectangular shape that its center matches that of the wiring substrate 7. In the basic part, about 16 solder balls form a line in the long-side direction of the wiring substrate 7 while about 12 solder balls form a line in the short-side direction thereof. Further, at the four corners of the array, additional one or two lines of solder balls 20 are formed on the outside. The solder balls 20 are not arranged in a region worth 2×6 balls (part surrounded by a long dashed double short dashed line) at the center of the wiring substrate 7 of the array.

The solder balls 20 thus formed are divided into signal electrodes 20A indicated by black circles in FIG. 3 and formed within a predetermined region at the center of the array indicated by the dashed line (hereinafter, "central region"), and dummy electrodes 20B indicated by white circles and formed on the outside of the signal electrodes 20A. The central region in which the signal electrodes 20A are formed is a region having a width about ⅓ the entire width in the long-side direction of the array. The signal electrodes 20A are formed and mixed with the dummy electrodes 20B in the central region. On the other hand, some of the dummy electrodes 20B are formed and mixed with the signal electrodes 20A in the central region, as described above. The remaining dummy electrodes spread out in the both-side direction of the central region, and in this area, only the dummy electrodes 20B are formed in an array to occupy the remaining region on the wiring substrate.

The signal electrodes 20A are used for transferring and receiving a signal, and function as data pins, command pins, power supply pins (such as grounding and Vdd), and clock pins, for example. Meanwhile, the dummy electrodes 20B are not used for transferring and receiving a signal, but are used for fixedly supporting the semiconductor package 40.

In this case, 224 solder balls 20 are formed, for example. Among those, there are 30 signal electrodes 20A and 194 dummy electrodes 20B. That is, the ratio in number between the signal electrodes 20A and the dummy electrodes 20B is about 2:13, and the proportion of the number of signal electrodes 20A to the entire region is about 13%.

The impact resistance and temperature resistance tests performed by the inventors found out that in joining parts of the lattice electrodes joined to the mounting substrate through soldering or the like, cracks are generated due to external stress such as impacts, and also due to solder fatigue caused by a temperature cycle, from a jointing part with a larger distance from the center, that is, from a joining part positioned on the outer side of the array. The tests also showed that there was a tendency that these cracks moved gradually towards the inner side. Accordingly, in the first embodiment, the signal electrodes 20A are formed on the center side of the lattice array and the dummy electrodes 20B are formed on the outside of the array. This lengthens the time taken until cracks are generated in the signal electrodes 20A, thereby improving the impact resistance and temperature cycle resistance. Furthermore, the cracks tend to appear first at the four corners of the array, that is, the position with a large distance from the center. Therefore, in the first embodiment, the additional one or two lines of the dummy electrodes 20B are further formed on the outside of the array at the four corners in the array. As a result, the adhesiveness at the corners can be enhanced, thereby leading to further improvement in the impact resistance and temperature cycle resistance.

To achieve the effects described above, it is effective to sufficiently increase the number of the dummy electrodes 20B placed around the signal electrodes 20A as compared to the number of signal electrodes 20A. Based on this, as in the first embodiment, when the number of the signal electrodes 20A was set to around 30 out of the total of 224 electrodes (about 13%), it was possible to achieve favorable effects such as the impact resistance and temperature cycle resistance.

With respect to the proportion of the signal electrodes 20A to all the electrodes, when the inventors adjusted the number of the signal electrodes in a semiconductor package of 14×18 mm similar to that of the first embodiment, a major effect was gradually achieved as the signal electrodes were reduced until the proportion of the number to the signal electrodes was made to about 10% (for example, 22 electrodes out of 224 electrodes). However, even when the number of signal electrodes was further reduced, there was no remarkable increase in the effect. When the same tests were performed for a semiconductor package of a different size in addition to the semiconductor package of 14×18 mm, it was found that the same effect was achieved with an approximately identical ratio.

The solder balls 20 do not necessarily have to be formed in alignment in a lattice at an equal pitch lengthwise and crosswise. The solder balls 20 can also be irregularly formed in groups (electrodes in a group) rather than at an equal pitch. Further, with respect to the outer peripheral shape of the group, not only square but also trapezoid, oval or the like can be adopted. That is, from among the solder balls forming the group, the signal electrodes are formed within a predetermined region of the center of the group and the dummy electrodes are formed on the outside of the signal electrodes, and therefore the effect substantially identical to that described above can be achieved.

Figure 4:
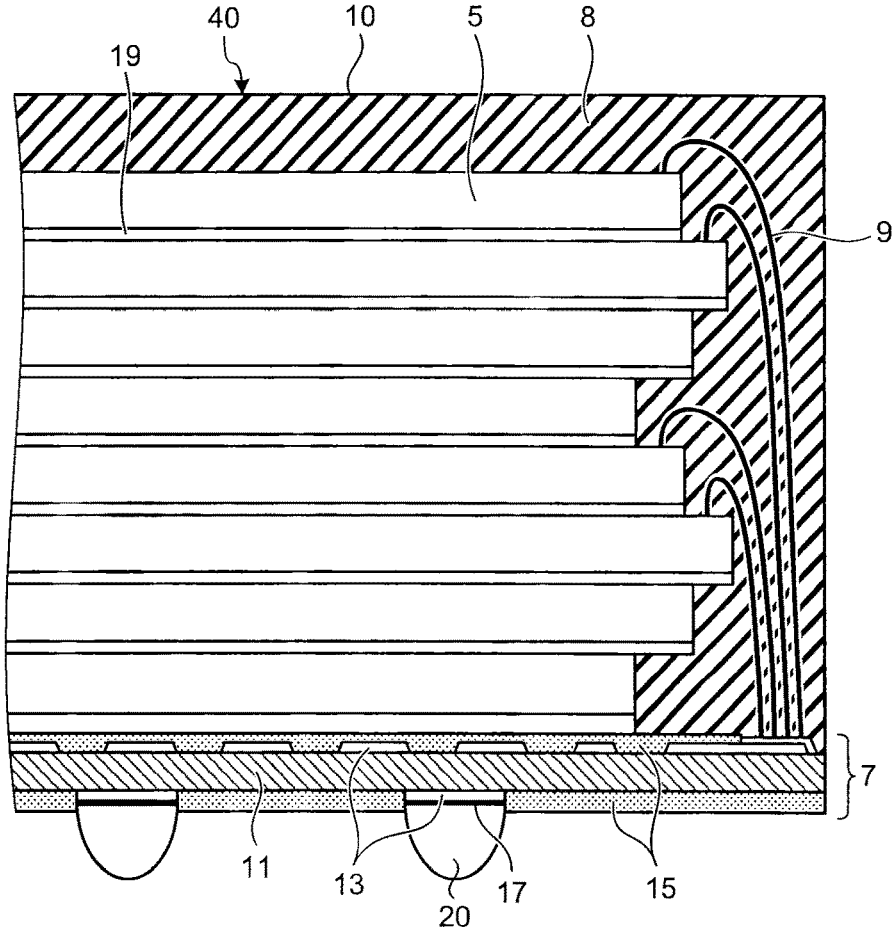
FIG. 4 is an enlarged partial cross-sectional view of a detailed structure of a semiconductor package.

A more detailed configuration of the first embodiment is explained. FIG. 4 is an enlarged partial cross-sectional view of a detailed structure of the semiconductor package 40. Specifically, the wiring substrate 7 is formed with a copper wiring pattern 13 on the surface of a core material 11 made of a resin material. The wiring substrate 7 is so fabricated that a copper foil is pasted on the plate-shaped core material 11, the surface is etched, for example, to form the copper wiring pattern 13, and the surface is coated with a solder resist 15 for the purposes of preventing oxidation to maintain insulation. A through hole not shown is formed in the core material 11 in a manner to match the array of the solder balls 20, and the wiring pattern 13 is so formed that it penetrates the through hole to be exposed on the second surface side of the wiring substrate 7. The solder balls 20 are formed on the wiring pattern 13 exposed from the core material 11, via an electrolytic plating 17 of either nickel or aluminum.

The eight semiconductor chips 5 are stacked by being fixed with a die attaching film 19 with one another. The die attaching film 19 is mixed with epoxy and polyamide, and serves as an adhesive agent. The bonding wires 9 extending from the semiconductor chips 5 are connected to the wiring pattern 13 at the end of the wiring substrate 7. To enable an easy connection of the bonding wires 9, the eight semiconductor chips 5 are stacked in a slightly deviating manner. That is, the semiconductor chips 5 on the upper side are stacked to be deviated by a predetermined amount to a side that faces the bonding wires 9 so that the other semiconductor chips 5 overlapped on the upper side are not overlapped on the top surface of the periphery to which the bonding wires 9 are connected. The semiconductor chips 5 are bonded with wiring for every two stacked semiconductor chips 5, and this pattern is repeated four times to stack the eight semiconductor chips. Thereafter, the encapsulation resin 8 is molded by a metal mold to cover the semiconductor chips 5 and the bonding wires 9.

Figure 5:
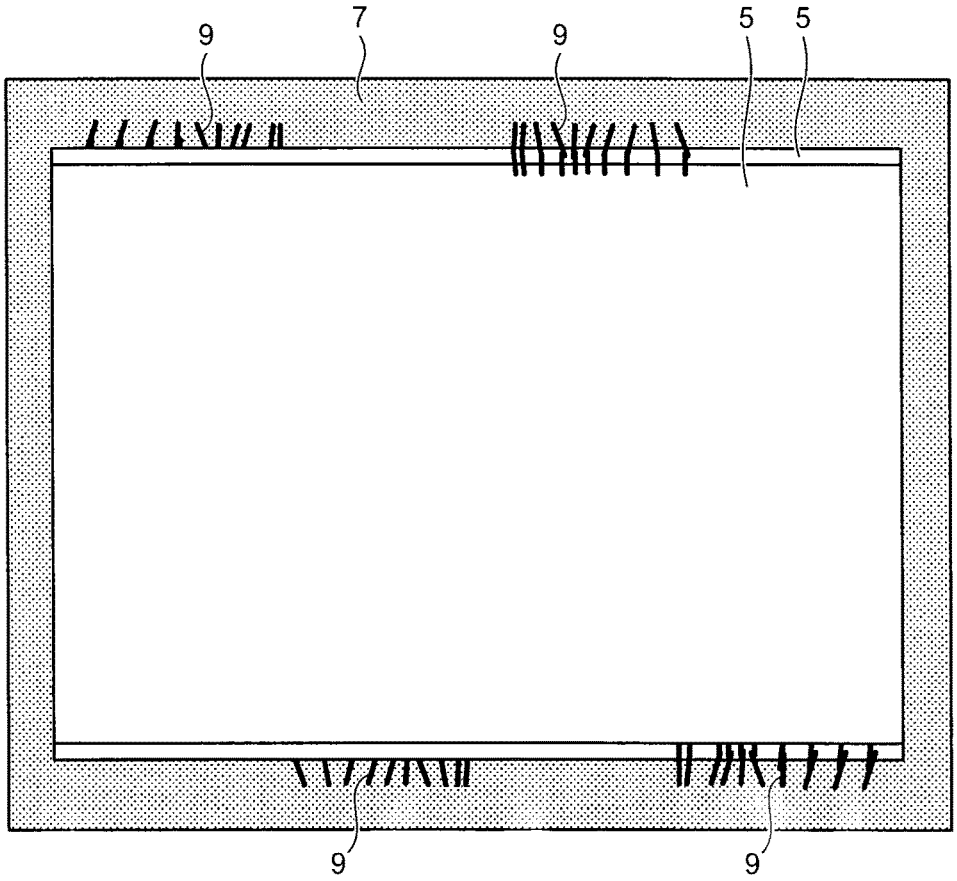
FIG. 5 depicts connection of bonding wires to semiconductor chips.

FIG. 5 depicts connection of the bonding wires 9 to the semiconductor chips 5, and also depicts a state that the encapsulation resin 8 is removed as seen from an arrow a side of FIG. 2. The bonding wires 9 are connected to one side of each semiconductor chip 5. As understood in combination of FIG. 2, two semiconductor chips 5 adjacent in the stacking direction form a set, and the bonding wires 9 extending from each set are separately connected at four different locations so as not to overlap one another in the stacking direction of the semiconductor chip 5. When the semiconductor chips 5 are stacked and bonded as described above, facilitating a work process and downsizing of the semiconductor package can be achieved.

The SSD 100 configured as above is mounted with the semiconductor package 40 including the semiconductor chips 5 formed with a non-volatile semiconductor memory constituted by a NAND flash memory, the resin encapsulation 10 that encapsulates the semiconductor chips, and the solder balls 20 formed to be arrayed in a lattice on the bottom surface of the resin encapsulation 10. In such a type of a semiconductor package, the electrodes (leads) do not extend in the direction along the mounting substrate 30 from the periphery (end surface) of the resin encapsulation 10, unlike in a TSOP semiconductor package. Therefore, at the time of mounting on the mounting substrate 30, the resin encapsulation 10 of the adjacent packages can be placed densely. Accordingly, the proportion of the area of the resin encapsulation 10 to the mounting substrate 30 can be increased, and consequently, a high density of semiconductor chips can be implemented. Further, in the first embodiment, the eight semiconductor chips are mounted in the single semiconductor package 40, and therefore the high density can be further improved. Further, the semiconductor package 40 is a BGA package, and does not use a lead frame at the time of forming the resin encapsulation 10. Thus, the thickness of the semiconductor package 40 can be reduced.

Further, the solder balls 20 of the SSD 100 according to the first embodiment include the signal electrodes 20A formed at the center of the lattice array (within a region about ⅓ the central part, in the long-side direction), and the dummy electrodes 20B formed outside of this region. Accordingly, the impact resistance and the temperature cycle resistance can be promoted, which leads to an improvement in the reliability of the SSD 100. The semiconductor package 40 has 224 solder balls 20 including a large number of the dummy electrodes 20B, and this number is far greater than the number of electrodes (leads), i.e., 46, of a TSOP package of the same size. Therefore, the heat generated in the semiconductor chips 5 can be favorably conducted to the mounting substrate 30 via the solder balls 20, and a favorable radiation effect is achieved as a result.

Figure 6:
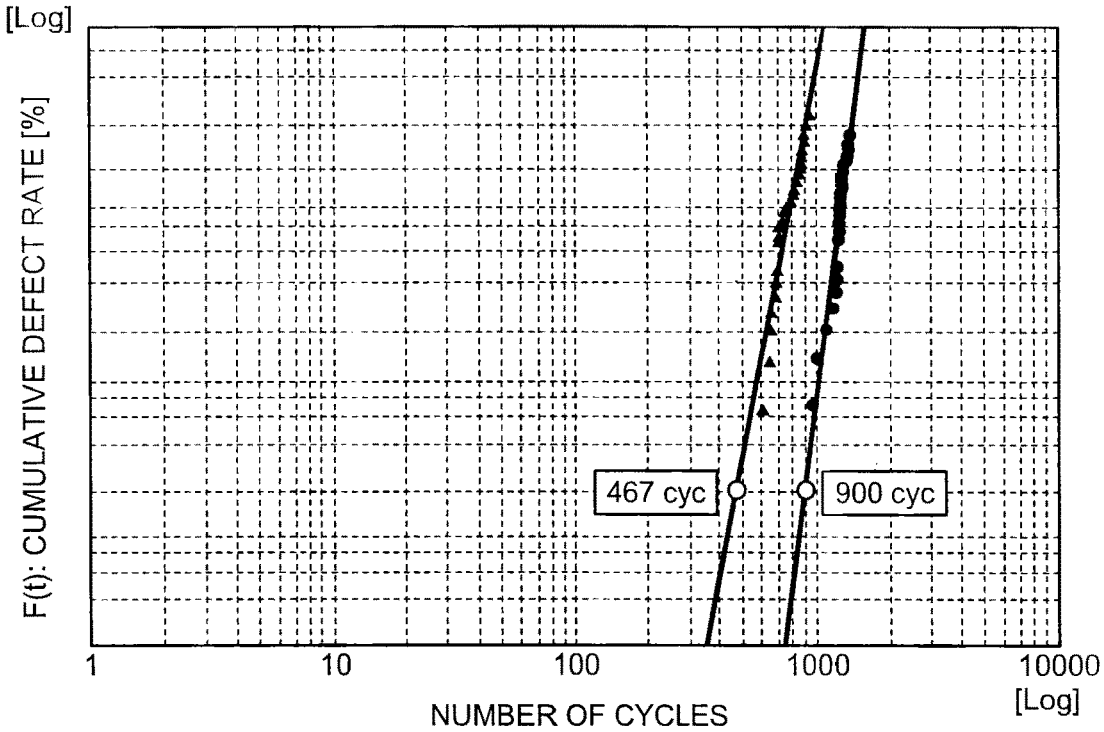
FIG. 6 depicts a logarithm graph for comparing a mounting reliability by a temperature cycle test for a BGA semiconductor package and a TSOP semiconductor package.

FIG. 6 depicts a logarithm graph for comparing a mounting reliability by a temperature cycle test for the BGA semiconductor package 40 used in the SSD 100 and a TSOP semiconductor package conventionally used. In the temperature cycle test, the temperature of the package was fluctuated between −25° C. and 125° C. at an interval of 30 minutes, and cumulative defect rates at that time were measured for comparison. A horizontal axis represents the number of cycles [number of times] while a vertical axis represents a cumulative defect rate [%]. In FIG. 6, triangular plot marks represent the number of cycles when a predetermined cumulative defect rate is reached in the TSOP package, while black circular plot marks represent the number of cycles when a predetermined cumulative defect rate is reached in the BGA package. For example, when comparing the numbers of cycles at which the cumulative defect rate of 1% is attained, this defect rate is attained at a cycle of 467 times in the TSOP semiconductor package while this defect rate is attained at a cycle of 900 times in the BGA semiconductor package 40. From this, it was demonstrated that the semiconductor package 40 according to the first embodiment had an operating life increased by about 1.93 times.

In the first embodiment, in the semiconductor package 70 incorporating semiconductor parts, such as a power supply circuit placed at the periphery of the mounting substrate 30, it is effective to fill an underfill agent (resin sealant) between the resin encapsulation 10 and the mounting substrate 30 so that the solder balls 20 are encapsulated, to improve the impact resistance and the temperature cycle resistance. With this configuration, the adhesiveness between the resin encapsulation 10 and the mounting substrate 30 is increased. In addition, the solder balls 20 are protected from the external stress, and as a result, the generation of cracks is further suppressed, thereby further improving the reliability of the SSD.

Meanwhile, out of the semiconductor packages 40, 50, and 60, with respect to the semiconductor packages 40 being placed densely to one another on the mounting substrate 30 and incorporating the NAND flash memory, it is effective to increase the number of dummy electrodes at the corners for reinforcement as described above, rather than using the underfill agent.

Figure 7:
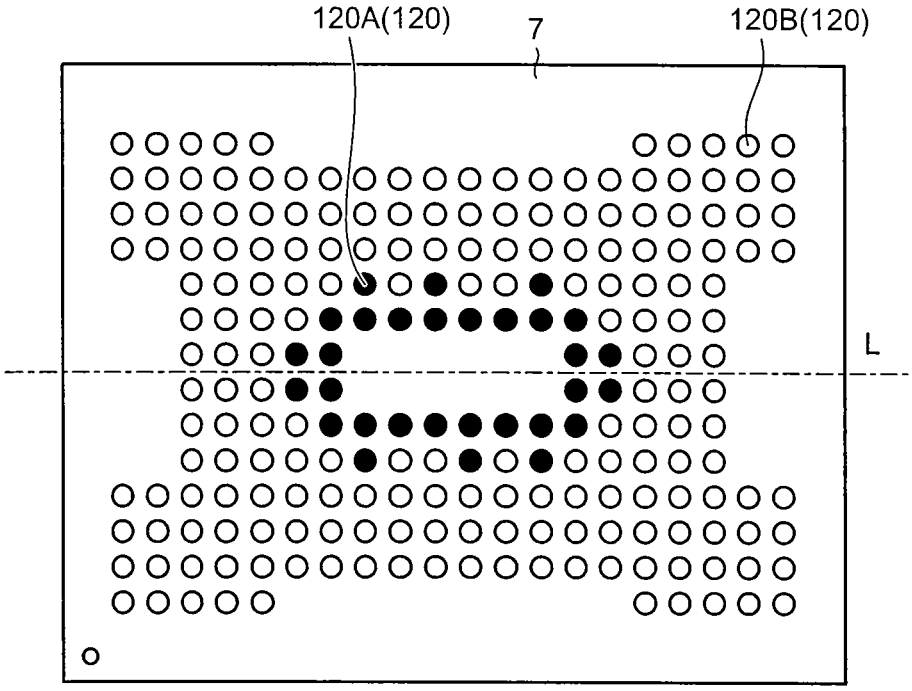
FIG. 7 depicts an arrangement of signal electrodes and dummy electrodes of a storage medium according to a second embodiment of the present invention.

FIG. 7 depicts an arrangement of signal electrodes and dummy electrodes of a storage medium according to a second embodiment of the present invention. Solder balls 120 according to the second embodiment can be divided into signal electrodes 120A indicated by black circles in FIG. 7 and formed at the center of a lattice array, and dummy electrodes 120B indicated by white circles and formed on the outside of the array. Also in the second embodiment, there are 224 solder balls 120, and out of these, there are 30 signal electrodes 120A while there are 194 dummy electrodes 120B. The signal electrodes 120A are formed within a region about ⅓ the central part in the both long-side direction and the short-side direction of the array.

The signal electrodes 120A according to the second embodiment are placed to exhibit line symmetry about a center line L on a plane of a second surface of the wiring substrate 7. When the signal electrodes 120A are placed to exhibit line symmetry about the center line, it becomes possible to eliminate the case that the cracks generate easily on any one half, that is, if there are cracks, they will be generated evenly. Therefore, the impact resistance and the temperature cycle resistance can be further improved. Furthermore, as described in the second embodiment, when the dummy electrodes 120B are placed in a manner to enclose the signal electrodes 120A across the entire circumference, the effect can be further increased.

Figure 8:
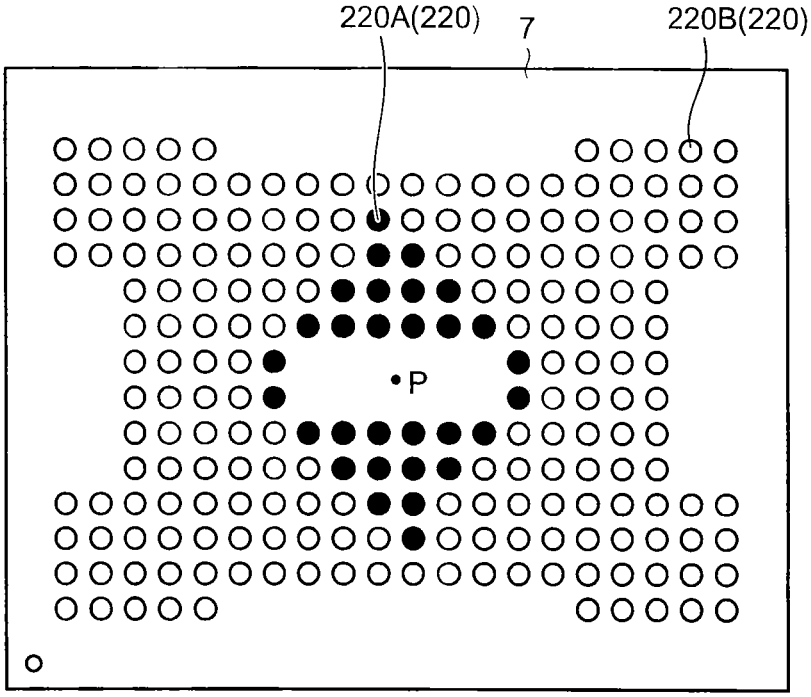
FIG. 8 depicts an arrangement of signal electrodes and dummy electrodes of a storage medium according to a third embodiment of the present invention.

FIG. 8 depicts an arrangement of signal electrodes and dummy electrodes of a storage medium according to a third embodiment of the present invention. Solder balls 220 according to the third embodiment can be divided into signal electrodes 220A indicated by black circles in FIG. 8 and formed at the center of a lattice array and dummy electrodes 220B indicated by white circles formed on the outside of the array. Also in the third embodiment, there are 224 solder balls 220, and out of these, there are 30 signal electrodes 220A while there are 194 dummy electrodes 220B. The signal electrodes 220A are formed within a region in an approximate square obtained by rotating by 45° at the central part relative to the array of which the entire shape is rectangular.

The signal electrodes 220A are placed to exhibit point symmetry about a center point P on a plane of a second surface of the wiring substrate 7. When the signal electrodes 220A are placed to exhibit point symmetry about the center, it becomes possible to eliminate the case that the cracks are easily generated on any one half. Therefore, effects substantially identical to those in the second embodiment can be achieved. As described in the third embodiment, when a region in which the signal electrodes 220A are formed is a region in an approximate square obtained by rotating by 45° at the central part, the signal electrodes 220A can be placed at the farthest location from the corners where the cracks can be generated easily. This is effective to improve the impact resistance and the temperature cycle resistance.

Figure 9:
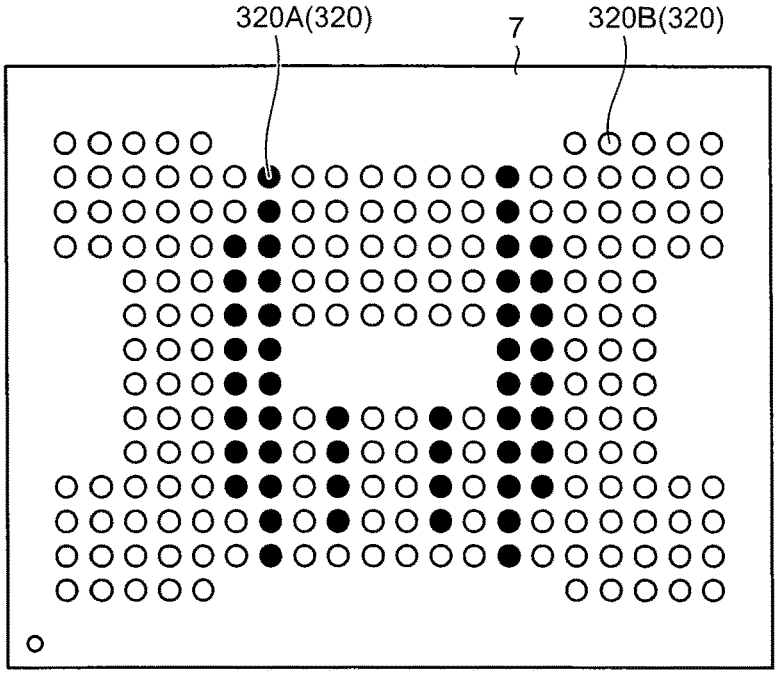
FIG. 9 depicts an arrangement of signal electrodes and dummy electrodes of a storage medium according to a fourth embodiment of the present invention.

FIG. 9 depicts an arrangement of signal electrodes and dummy electrodes of a storage medium according to a fourth embodiment of the present invention. Solder balls 320 according to the fourth embodiment can be divided into signal electrodes 320A indicated by black circles in FIG. 9 and formed at the center of a lattice array and dummy electrodes 320B indicated by white circles and formed on the outside of the array. Also in the fourth embodiment, there are 224 solder balls 320, and out of these, there are 48 signal electrodes 320A while there are 176 dummy electrodes 320B. That is, the number of the signal electrodes 320A is increased as compared to that in the first to third embodiments. The central region in which the signal electrodes 320A are formed is a region having a width about ½ the entire width of the array.

In the near future, it is expected that in the semiconductor package, the number of signal electrodes is increased to correspond to the fact that the semiconductor chips are further multilayered, for example. However, as described in the first embodiment, when achieving the effect of the impact resistance and the temperature cycle resistance provided by the dummy electrodes, it is not effective to reduce the number of pins of the dummy electrodes surrounding the signal electrodes beyond the required number relative to the signal electrodes. However, as described in the fourth embodiment, out of a total of 224 electrodes, when the number of the signal electrodes 320A is 48 (about 21% of the total number) and when the central region in which the signal electrodes 320A are formed is a region having a width about ½ the entire width of the array, a favorable effect is achieved.

When the inventors repeated tests while increasing the proportion of the signal electrodes, it was possible to improve the impact resistance and temperature cycle resistance until the number of signal electrodes was reduced to 66 (about 30%). However, when the number was further increased, there was no significant improvement in the impact resistance and temperature cycle resistance. Furthermore, when the central region in which the signal electrodes are formed was changed to a region having a width equal to or more than ½ the entire width of the array, the effect deteriorated significantly. As a result, in view of these test results of the first embodiment, it was found out that the appropriate region in which the signal electrodes are formed was a region having a width in a range of about ⅓ to ½ the entire width. For example, the appropriate examples include 5.6/14.4≈⅓ (the example shown in FIG. 3), and 7.2/14.4≈½ (the example shown in FIG. 9). It was also found out that it is appropriate to set the proportion of the signal electrodes to the entire electrodes is less than 30%, and desirably, the proportion was less than 20%. It was also found out that when the proportion of the signal electrodes was equal to or more than 10% and less than 30%, the effect was achieved effectively. Note that it has become known from the test that the relationship between the ratio of the signal electrodes and the effect is not limited to a semiconductor package of 14×18 mm, and a substantially identical result was obtained in semiconductor packages of other sizes as well.

In the SSD of the first to fourth embodiments, the BGA semiconductor package is adopted for the purposes of achieving a high density of the semiconductor chips. However, to achieve the same purpose, not only a semiconductor package of BGA but also that of LGA can be used. In the LGA semiconductor package, instead of the solder balls, very small and flat electrodes in a lattice, which are called "land", are formed on the bottom surface of the resin encapsulation. The rest of the configuration of the LGA semiconductor package is similar to that of the BGA semiconductor package. These electrodes are forced into a socket shaped like a pin support (pin holder) in which pins corresponding to the respective electrodes form a line in a lattice, and attached to the mounting substrate.

According to the tests conducted by the inventors, also in the LGA semiconductor package, starting from a joint that is farthest from the center, defective joining is generated at the joints of the lattice electrodes due to external stress, such as impacts. The defective joining gradually moves towards the inner-side electrodes with the passage of time. Thus, also in the LGA semiconductor package, the signal electrodes and the dummy electrodes are placed based on the same concept as in the first to fourth embodiments, and therefore the durability against external stress can be improved.

Further, according to the inventors, not only in the BGA or LGA semiconductor packages, but also in any type of semiconductor package having a plurality of electrodes formed in an array on the bottom surface of the resin encapsulation, the defective joining is generated at the joints due to external stress, such as impacts, starting from the joint that is farthest from the center. Therefore, when signal electrodes and dummy electrodes are formed based on the same concept as in the first to fourth embodiments, the durability against external stress can be improved.

Figure 10:
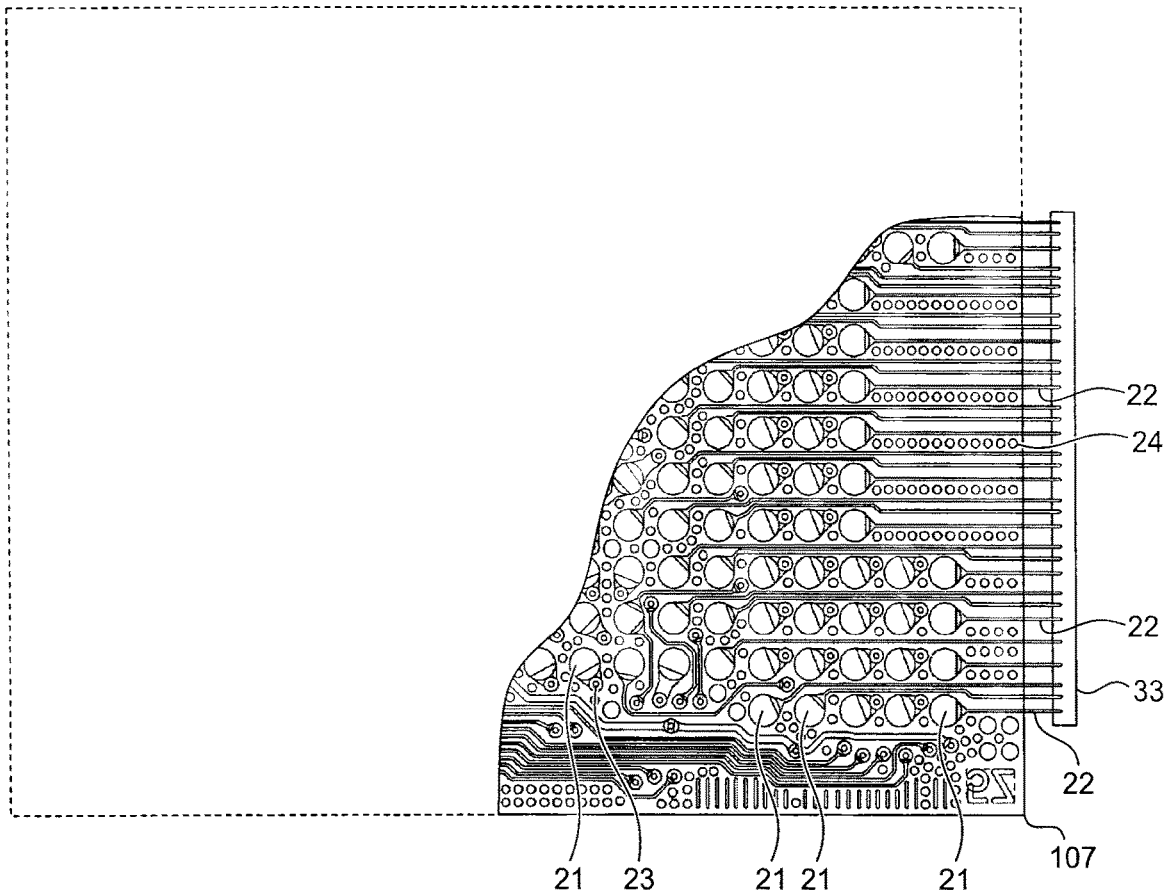
FIG.10 Prior Art
FIG. 10 depicts a part of a wiring pattern on a second surface of a conventional wiring substrate.

An object of a fifth embodiment of the present invention is explained by describing a configuration of a wiring substrate of a conventional semiconductor package that corresponds to a semiconductor package according to the fifth embodiment. FIG. 10 depicts a part of a wiring pattern formed on a second surface (a surface on which solder balls are formed) of a wiring substrate 107 of the conventional semiconductor package having a structure similar to that of the semiconductor package according to the fifth embodiment. The wiring pattern is configured to include solder-ball (projection-electrode) forming pads (hereinafter, "pads") 21 for forming solder balls (projection electrodes), on its surface. The pads 21 are arrayed and formed in a lattice to set to the positions of the solder balls.

The surface of respective pad 21 is plated so that the solder balls can be formed easily. At the time of plating the pads 21 at a step of manufacturing a semiconductor package, the plating is performed while respective pad 21 is applied voltage. A plating process electrode 33 for applying voltage to respective pad 21 is placed at the edge of the wiring substrate 107 at the time of the plating process (FIG. 10). Thus, patterns for supplying plating process power to respective pad 21 from the plating process electrode 33 (hereinafter, "plating lines 22") are previously arranged in an extending manner to reach the edge of the wiring substrate 107 from respective pad 21.

Although not shown, the edge of a first surface (surface on which the semiconductor chips are formed) opposite to the wiring substrate 107 is formed with bonding pads (bonding fingers). The bonding wires extending as signal lines or power supply lines from the semiconductor chips are connected to the bonding pads. The pads 21 for a signal line or a power supply line, out of a plurality of pads 21 formed on the second surface, are electrically connected to these bonding pads via through holes 23 by a predetermined pattern. Thus, the pads 21 for a signal line or a power supply line can utilize the pattern at the time of the plating process to apply the voltage. As a result, the plating lines are not needed. The plating lines are needed by the pads 21 for a dummy electrode not connected to the bonding pads. On the wiring substrate 107, dummy patterns 24 in a round small circle for burying vacant regions on the substrate to prevent the warping of the substrate, for example, are also formed.

A large number of dummy electrodes exist in the outer region of the array, similarly to those in the first to fourth embodiments. Thus, the plating lines 22 extending from respective pad 21 for a dummy electrode occupy a large area on the substrate surface (FIG. 10). As a result, there is a case that the degree of freedom of a pattern layout for a signal line or a power supply line, of which the roles are inherently important, deteriorates, and another case is that because there are a very large number of plating lines 22, the pattern becomes complicated, resulting in a factor for a cost increase, and thus the improvement is desired. Further, due to the influence that an allowable width of a reference voltage of the recent semiconductor chips is narrowed, there is a demand that the power supply applied to the semiconductor chip is more stabled. To supply the power supply stably, it is desired that the pattern for a power supply line is laid out as linearly as possible and also the pattern course is as short as possible. However, due to the existence of the plating lines 22, it is difficult to set the desired course, and thus the improvement is desired. The fifth embodiment is intended to solve such problems, and is described below.

Figure 11:
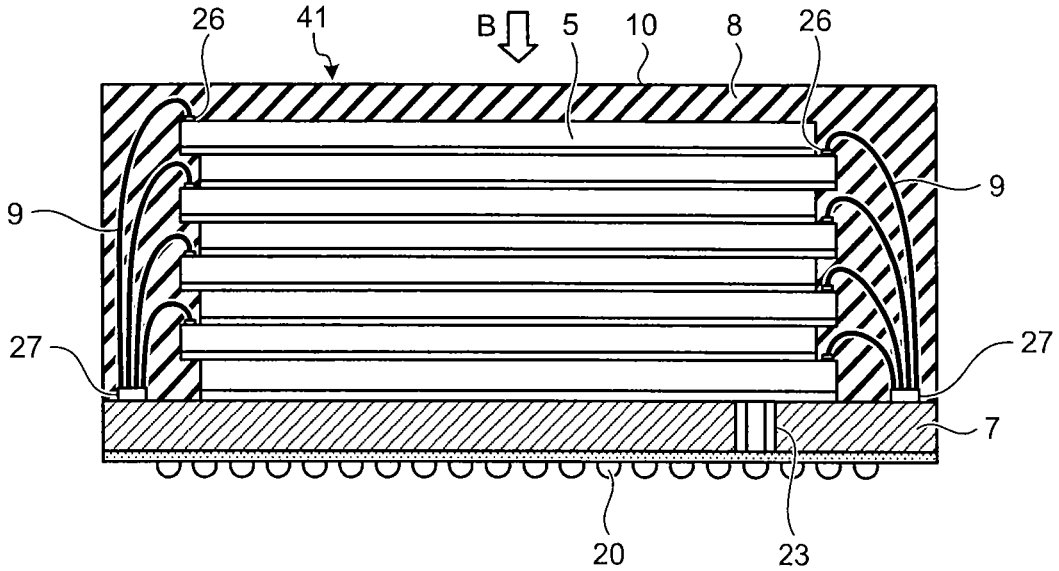
FIG. 11 is a cross-sectional view of a part having a semiconductor package according to a fifth embodiment of the present invention mounted thereon.

FIG. 11 is a cross-sectional view of how the semiconductor chips 5 of the semiconductor package 41 according to the fifth embodiment are stacked. The semiconductor package 41 is configured by the eight semiconductor chips 5, the resin encapsulation 10 that encapsulates the semiconductor chips 5 with a resin, and the solder balls 20 formed and arrayed in a lattice on the bottom surface of the resin encapsulation 10. The resin encapsulation 10 includes the wiring substrate 7, the encapsulation resin 8, and the bonding wire 9. On the wiring substrate 7, the semiconductor chips 5 are mounted on a first surface, and the solder balls 20 are formed on a second surface that faces the first surface. The bonding wires 9 electrically connect chip pads 26 arranged at edges alternately different to one another on the stacked semiconductor chips 5 and a bonding pad 27 arranged at the edge of the wiring substrate 7. The solder balls 20 are electrically connected to the bonding pad 27 by patterns formed on the first surface and the second surface on the wiring substrate 7. The pattern formed on the first surface and the pattern formed on the second surface are connected by the through hole 23. On the semiconductor chips 5, a non-volatile semiconductor memory constituted by a NAND flash memory is formed similarly to those in the first to fourth embodiments.

Figure 12:
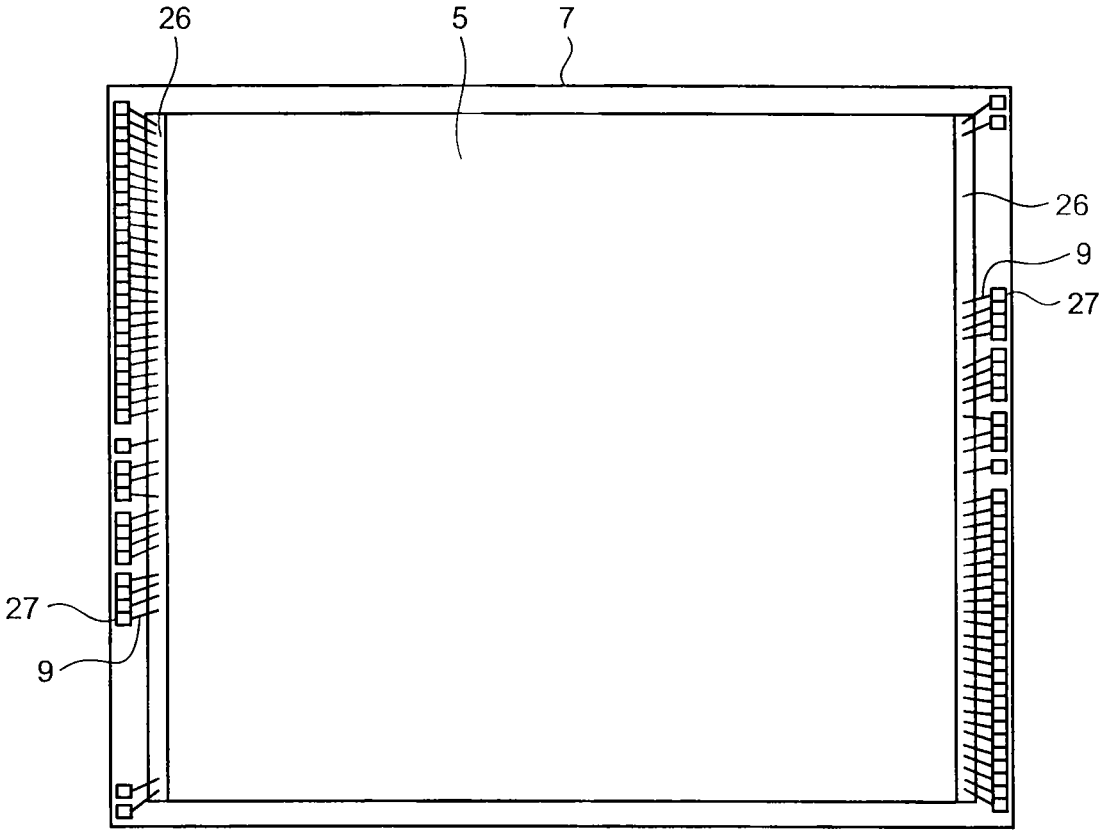
FIG. 12 depicts wire-bonding of a semiconductor chip to a wiring substrate of the fifth embodiment.

FIG. 12 depicts wire-bonding of the semiconductor chip 5 to the wiring substrate 7, and also depicts a state that the encapsulation resin 8 is removed as seen from an arrow B side in FIG. 11. The bonding pads 27 according to the fifth embodiment are arranged at edges of two short sides on the rectangular wiring substrate 7, differently from the bonding pads according to the first to fourth embodiments. The bonding wires 9 extending from the chip pad 26 of the semiconductor chip 5 are connected to the bonding pads 27. Thus, the bonding pads 27 are arranged on the two short sides on the wiring substrate 7. As a result, the distance to the central region of the substrate is longer. Accordingly, in the pattern for a power supply line, an improved linearity is required.

Figure 13:
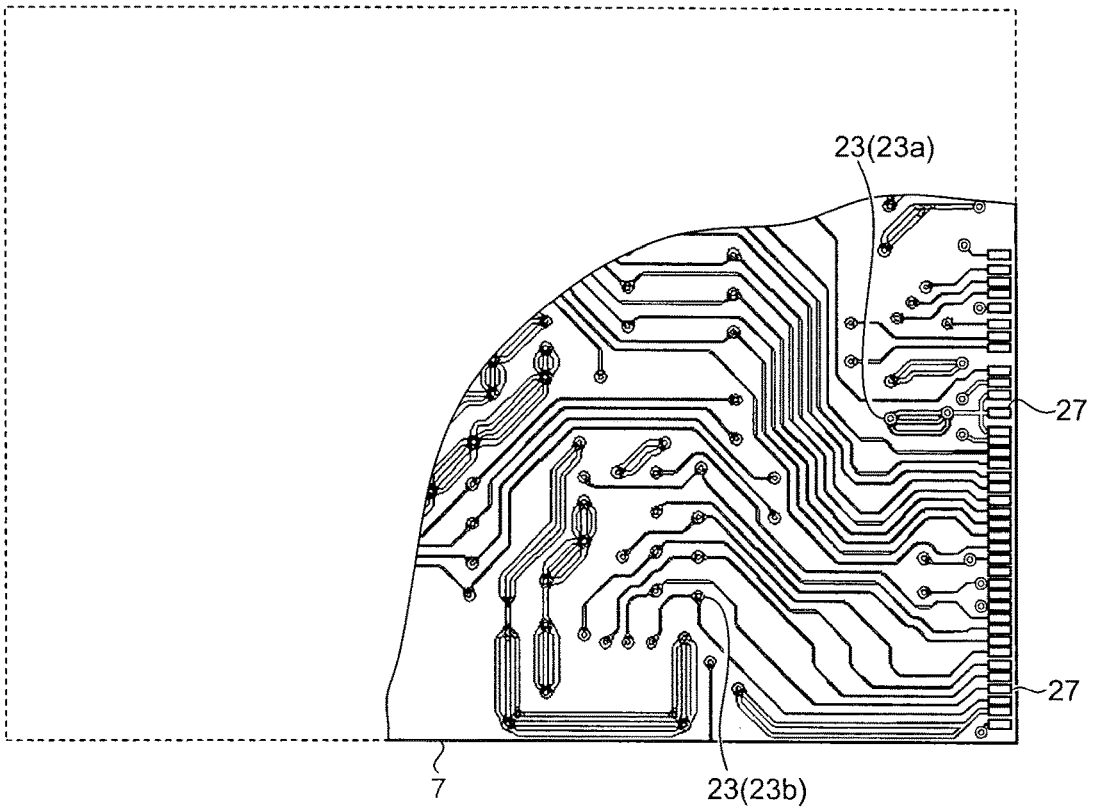
FIG. 13 depicts a part of a wiring pattern on a first surface of the wiring substrate of the fifth embodiment.
Figure 14:
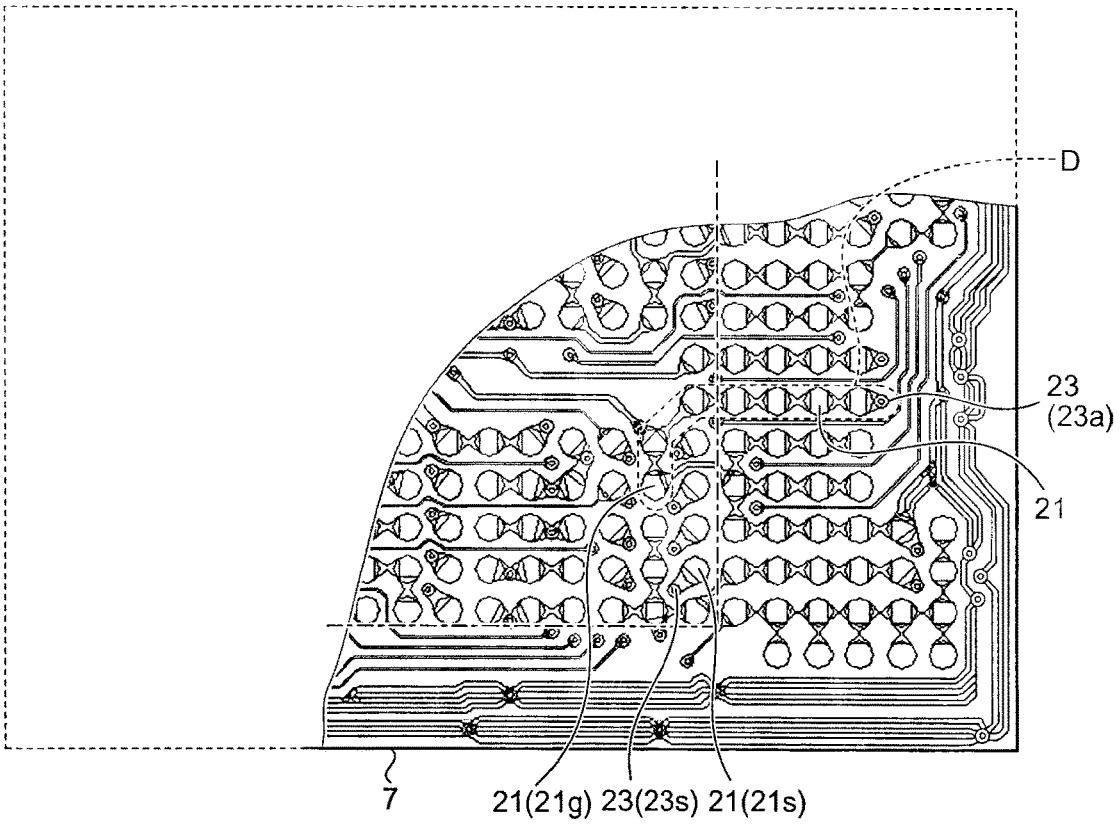
FIG. 14 depicts a part of a wiring pattern on a second surface of the wiring substrate of the fifth embodiment.

FIG. 13 depicts a part of the wiring pattern formed on the first surface on the wiring substrate 7 according to the fifth embodiment. FIG. 14 depicts a part of the wiring pattern similarly formed on the second surface of the wiring substrate 7. In FIGS. 13 and 14, the dummy pattern and the like for preventing the warping of the wiring substrate 7 are omitted. On the first surface on the wiring substrate 7 shown in FIG. 13, the bonding pads 27 arranged on the short side on the wiring substrate 7 and predetermined through holes 23 are connected by patterns. On the other hand, on the second surface side on the wiring substrate 7 shown in FIG. 14, a plurality of pads 21 including pads for a signal line or a power supply are formed in an array in the central region (within a long dash short dash line frame in FIG. 14) of the array. In the outer region thereof, the pads 21 for a dummy electrode are formed in an array. The through holes 23 and the predetermined pads 21 are connected by patterns. As described above, an electric route from the semiconductor chip 5 through the bonding wires 9 to the bonding pads 27 is drawn by a predetermined pattern on the first surface on the wiring substrate 7, and thereafter, reaches the second surface side via the through holes 23, and extends to the pads 21 for a signal line or a power supply line formed in the central region.

In this case, on the second surface side on the wiring substrate 7 shown in FIG. 14, the pattern for a signal line, for example, extends via the through hole 23 (23s) to one pad 21 (21s) for a signal line within the central region. On the other hand, the pattern for a power supply extends from the through hole 23 (23a) over a plurality of pads 21 for a dummy electrode to the pad 21 (21g) for a power supply line within the central region.

Figure 15:
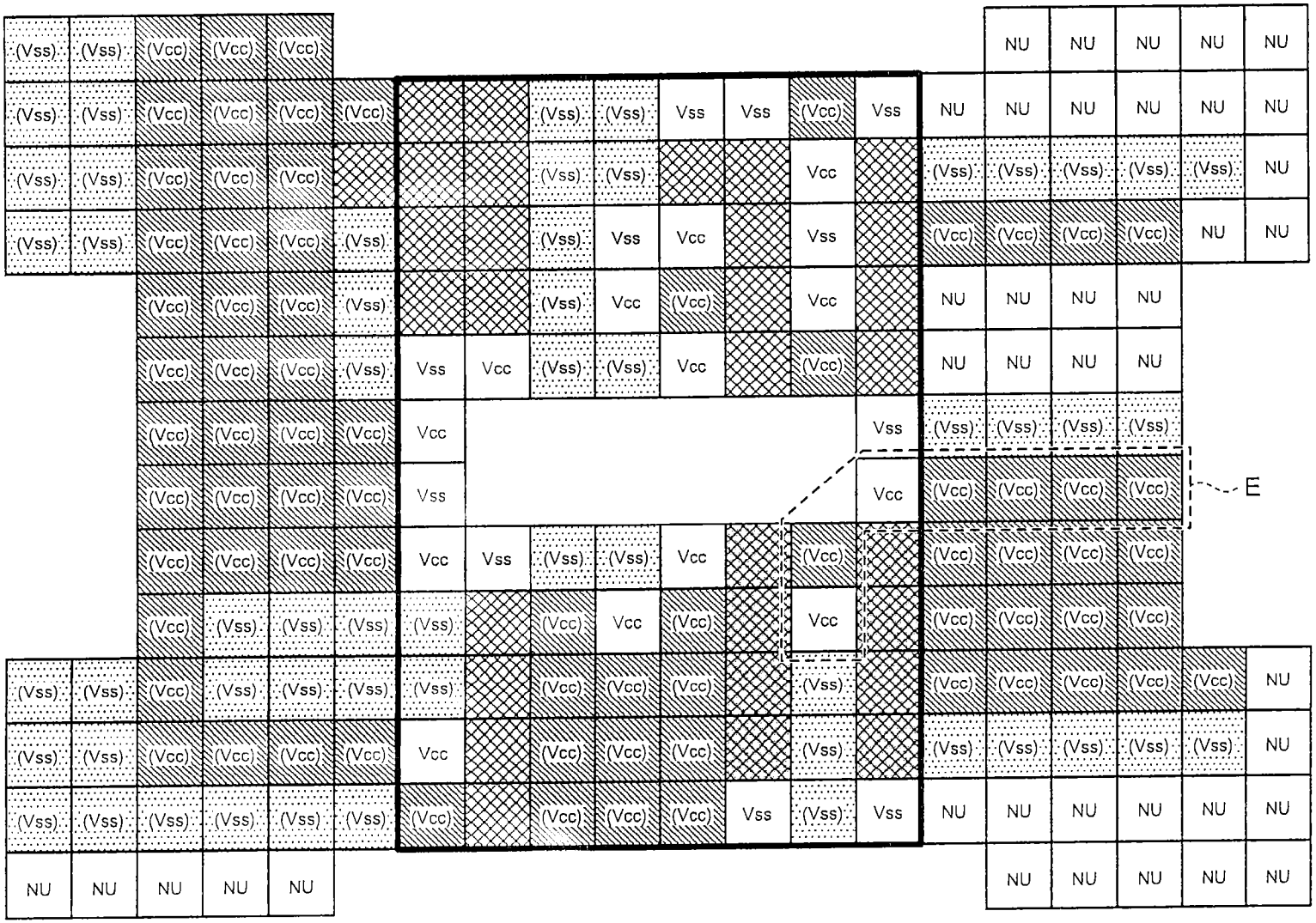
FIG. 15 depicts a pin assignment of solder balls arranged on the second surface on the wiring substrate.
Figure 16:
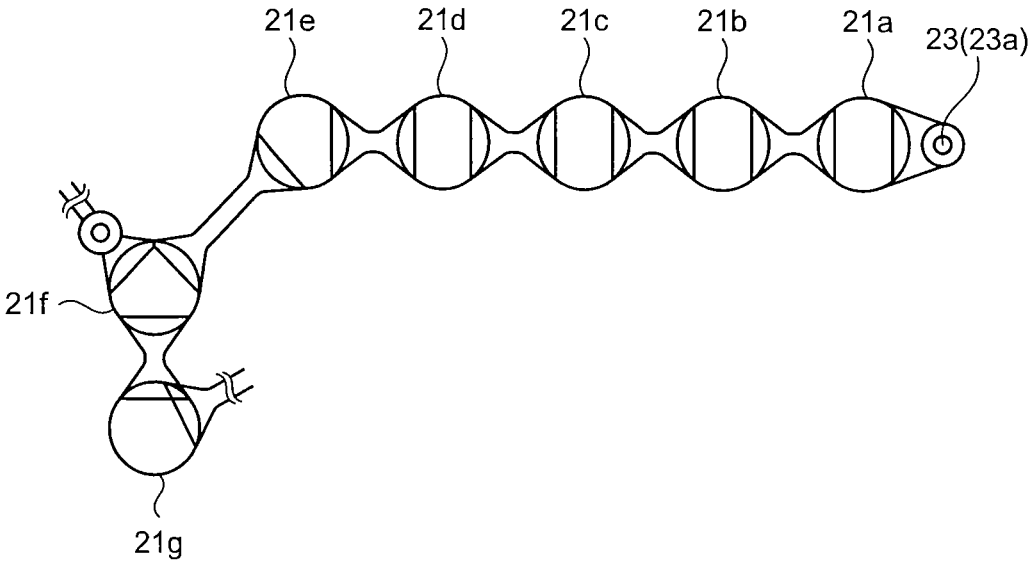
FIG. 16 is an enlarged view of a part of linked pads shown in FIG. 14.

The pattern for a power supply is described further in detail. FIG. 15 depicts a pin assignment of the solder balls arranged on the second surface on the wiring substrate 7. In FIG. 15, in the central region (within a bold-lined frame in FIG. 15) of the array, a plurality of electrodes including electrodes for a signal line and a data line (hatched region without characters in FIG. 15) or a power supply line (Vcc and Vss in FIG. 15) are formed in an array. On the other hand, in the outer region (outside the bold-lined frame in FIG. 15), a plurality of electrodes including the dummy electrode ((Vcc), (Vss), and NU in FIG. 15) are formed in an array. In the pin assignment in FIG. 15, seven Vccs (four Vccs forming a line in the right and left directions in the outer region in FIG. 15 and three Vccs forming a line in an L-letter shape within the central region) in a part indicated by E in FIG. 15, for example, are electrically connected to one another. A wiring pattern connecting this part is seven pads indicated by D in FIG. 14. An enlarged part D in FIG. 14 is shown in FIG. 16. In FIG. 16, the seven pads (pads 21a to 21g) starting from the through hole 23 (23a) electrically connect the seven Vccs in the part indicated by E in FIG. 15. These pads (pads 21a to 21g) are connected to the bonding pad 27 (FIG. 13) via the through hole 23 (23a).

As described above, the seven Vccs in the part indicated by E in FIG. 15 are connected to one another, and from any one of the pads 21a to 21g, a power supply is enabled. However, in an actual product, the power is supplied from the solder balls (three Vccs forming a line in an L-letter shape within the central region) formed on the pads 21e to 21g. The reason for this is to improve the reliability for the impact resistance and temperature cycle resistance, as described in the first to fourth embodiments. By a similar configuration, the respective pad in a group of Vccs (Vccs) and a group of Vss's (Vss's) shown in the pin assignment in FIG. 15 is electrically connected to each other. A plurality of NUs located at the corners of the pin assignment in FIG. 15 are electrically connected to one another by a plurality of linked pads, and the linked pads are further connected with one plating line extending to the edge on the wiring substrate.

A plurality of pads 21 adjacent in this way are linked by the short pattern, and further, the groups of linked pads are electrically connected to the bonding pads 27. Therefore, a plurality of connected pads 21 for a dummy electrode become able to supply power from the bonding pads 27 at the time of plating, and thus the plating line is not needed. As a result, the number of plating liens is greatly reduced, and thus the pattern layout becomes easy. Accordingly, the pattern for a power supply line can be made linear with the shortest course.

The present invention is not limited to the above embodiments, and can be embodied by modifying constituent elements without departing from the scope of the invention. Furthermore, various inventions can be created by combinations of the constituent elements disclosed in the above embodiments. For example, some of the whole constituent elements disclosed in the embodiments can be omitted, and the constituent elements according to different embodiments can be suitably combined with each other.

What is claimed is:

[1. A storage medium comprising:

a semiconductor package having a semiconductor chip, a resin encapsulation that encapsulates the semiconductor chip, and a plurality of electrodes arrayed on a bottom surface of the resin encapsulation; and a substrate including a conductor that joins the electrodes, and having the semiconductor package mounted thereon, wherein the electrodes include a plurality of signal electrodes formed within a central region of the array, and a plurality of dummy electrodes formed in an outer region of the signal electrodes, each of the signal electrodes includes a first pad as a projection-electrode forming pad for a power supply line or a signal line, and a first projection electrode formed on the first pad, and each of the dummy electrodes includes a second pad as a projection-electrode forming pad for a dummy electrode and a second projection electrode formed on the second pad.]

[2. The storage medium according to claim 1, wherein only the dummy electrodes among the signal electrodes and the dummy electrodes are disposed in the outer region.]

[3. The storage medium according to claim 1, wherein the dummy electrode further includes a third pad for burying a vacant region, and no projection electrode is formed on the third pad.]

[4. The storage medium according to claim 1, wherein the central region in which the signal electrodes are formed has a region of a width about ⅓ to ½ of entire width of the array.]

[5. The storage medium according to claim 1, wherein a proportion in number of the signal electrodes to the electrodes is less than 30%.]

[6. The storage medium according to claim 1, wherein a proportion in number of the signal electrodes to the electrodes is less than 20%.]

[7. The storage medium according to claim 1, wherein the signal electrodes are placed to exhibit line symmetry about a center line of the array formed by the electrodes or point symmetry about a center of the array.]

[8. The storage medium according to claim 1, wherein the dummy electrodes are formed to enclose entire circumference of the signal electrodes.]

[9. The storage medium according to claim 1, wherein semiconductor chips are stacked and encapsulated in the resin encapsulation.]

[10. The storage medium according to claim 1, wherein the semiconductor chip has a NAND flash memory incorporated therein.]

[11. A semiconductor package comprising:

a semiconductor chip;

a wiring substrate having the semiconductor chip mounted on a first surface; and a plurality of projection electrodes formed on a second surface opposite to the first surface of the wiring substrate, wherein a bonding pad, to which a bonding wire extending from the semiconductor chip is connected, is formed at an edge of the first surface on the wiring substrate, and a plurality of projection-electrode forming pads for forming the projection electrodes are arrayed and formed in a lattice on the second surface, and the projection-electrode forming pads include first projection-electrode forming pads as projection-electrode forming pads for a power supply line formed within a central region of the array and second projection-electrode forming pads as projection-electrode forming pads for a dummy electrode formed in an outer region of the central region, the projection electrodes include first projection electrodes formed on the first projection-electrode forming pads and second projection electrodes formed on the second projection-electrode forming pads, two or more second projection-electrode forming pads among the second projection-electrode forming pads are connected to one another by a connection pattern formed on the second surface, and the first projection-electrode forming pads are connected to the bonding pad through the plurality of second projection-electrode forming pads connected by the connection pattern, and a through hole formed in the wiring substrate.]

[12. The semiconductor package according to claim 11, wherein in the second projection-electrode forming pads connected by the connection pattern, the second projection-electrode forming pads adjacent to each other are connected.]

[13. The semiconductor package according to claim 11, wherein only the second projection-electrode forming pads are disposed in the outer region.]

[14. The semiconductor package according to claim 11, wherein the wiring substrate forms a rectangle, and the bonding pad is arranged at an edge on a short side of the wiring substrate.]

[15. The semiconductor package according to claim 11, wherein the semiconductor chips are stacked and mounted on the wiring substrate.]

*16. A storage device comprising:*

*a semiconductor package including a plurality of semiconductor chips, a substrate, a resin encapsulation that encapsulates the plurality of semiconductor chips, and an array of electrodes on a bottom surface of the substrate, the plurality of semiconductor chips being mounted on the substrate; wherein*

*the electrodes include a plurality of signal electrodes formed within a central region of the array, a plurality of dummy electrodes formed on an outer region outside of the central region, and a proportion of a number of the signal electrodes to a total number of the electrodes is 10-30%,*

*the signal electrodes include a first pad as a projection-electrode forming pad for a power supply line or a signal line, and a first projection electrode formed on the first pad, and*

*the dummy electrodes include a second pad as a projection-electrode forming pad for a dummy electrode and a second projection electrode formed on the second pad.*

*17. The storage device according to claim 16, wherein*

*the outer region includes a first region and a second region, the first region including the dummy electrodes surrounding the central region and including four corners, the second region including one or more lines of the dummy electrodes formed outside of the four corners of the first region.*

*18. The storage device according to claim 16, wherein only the dummy electrodes among the signal electrodes and the dummy electrodes are disposed in the outer region.*

*19. The storage device according to claim 16, wherein at least one of the dummy electrodes further includes a third pad for burying a vacant region, and no projection electrode is formed on the third pad.*

*20. The storage device according to claim 16, wherein the central region in which the signal electrodes are formed has a region of a width about ⅓ to ½ of an entire width of the array.*

*21. The storage device according to claim 16, wherein a proportion in number of the signal electrodes to the electrodes is less than 20%.*

*22. The storage device according to claim 16, wherein the signal electrodes are placed to exhibit line symmetry about a center line of the array formed by the electrodes or point symmetry about a center of the array.*

*23. The storage device according to claim 16, wherein the dummy electrodes are formed to enclose an entire circumference of the signal electrodes.*

*24. The storage device according to claim 16, wherein the semiconductor chips are stacked and encapsulated in the resin encapsulation.*

*25. The storage device according to claim 24, the substrate comprises a wiring substrate, wherein*

*the wiring substrate and a plurality of bonding wires are encapsulated in the resin encapsulation,*

*the bonding wires are electrically connected to the semiconductor chips and the wiring substrate,*

*the bonding wires extending from the semiconductor chips are connected to a wiring pattern at an end of the wiring substrate, and*

*the semiconductor chips are stacked in a slightly deviating manner in the resin encapsulation.*

*26. The storage device according to claim 25, wherein*

*the semiconductor chips are stacked to be deviated by a predetermined amount such that top surfaces of peripheries of the semiconductor chips to which the bonding wires are connected are not overlapped by another one of the semiconductor chips, and*

*one of the bonding wires is connected to one side of each of the semiconductor chips.*

*27. The storage device according to claim 25, wherein*

*the electrodes form a line in a long-side direction of the array and a line in a short-side direction of the array, and*

*the electrodes are arrayed in an approximate rectangular shape that has a center matching that of the wiring substrate.*

*28. The storage device according to claim 25, further comprising:*

*bonding pads arranged on a short side of the wiring substrate, and*

*through holes in the wiring substrate are connected by patterns on the wiring substrate.*

*29. The storage device according to claim 25, wherein the first pads are electrically connected to at least one of the semiconductor chips by a through hole and a pattern on the wiring substrate.*

*30. The storage device according to claim 16, wherein at least one of the semiconductor chips has a NAND flash memory incorporated therein.*

*31. The storage device according to claim 16, wherein*

*the semiconductor package is 14×18 mm in outer dimension, and*

*the semiconductor package is a maximum of 1.46 millimeters in height.*

*32. The storage device according to claim 16, wherein*

*the central region has a width about ⅓ of an entire width in a long-side direction of the array,*

*the signal electrodes and a subset of the dummy electrodes are in the central region, and*

*the remaining dummy electrodes are spread out in the outer region in at least one long-side direction from the central region.*

*33. The storage device according to claim 16, wherein*

*the outer region is located on both sides of the central region, and*

*the dummy electrodes are formed in an array to almost occupy at least one of the sides of the outer region.*

*34. The storage device according to claim 16, wherein*

*the dummy electrodes are formed in two lines in a short-side direction of the array on the outer region, and*

*each of the lines includes at least three projection-electrodes.*

*35. The storage device according to claim 34, wherein*

*the signal electrodes include Vcc electrodes;*

*the Vcc electrodes are formed in a Vcc electrode line in the short-side direction, and*

*the Vcc electrode line is next to the two dummy electrode lines.*

*36. The storage device according to claim 16, wherein*

*three dummy electrodes are formed in the outer region, and*

*at least a Vcc electrode in the central region form a line in a long-side direction of the array.*

*37. The storage device according to claim 16, wherein at least one of the semiconductor chips includes a plurality of memory cells, the memory cells being capable of multiple-valued recording.*

*38. A storage system comprising:*

*a semiconductor package having a plurality of semiconductor chips, a first substrate, a resin encapsulation encapsulating the plurality of semiconductor chips, and an array of electrodes on a bottom surface of the first substrate; and*

*a second substrate; wherein*

*the semiconductor package is mounted on the second substrate,*

*the electrodes include a plurality of signal electrodes on a central region of the bottom surface, and a plurality of dummy electrodes on an outer region outside of the central region,*

*a proportion of a number of the signal electrodes to a total number of the plurality of electrodes is 10-30%,*

*the signal electrodes include a first pad as a projection-electrode forming pad for a power supply line or a signal line, and a first projection electrode formed on the first pad, and*

*the dummy electrodes include a second pad as a projection-electrode forming pad for a dummy electrode and a second projection electrode formed on the second pad.*

*39. The storage system according to claim 38, wherein*

*the outer region includes a first region and a second region, the first region including the dummy electrodes surrounding the central region and including four corners, the second region including one or more lines of the dummy electrodes formed outside of the four corners of the first region.*

*40. The storage system according to claim 38, wherein the second substrate includes a plurality of conductors, the plurality of conductors including first conductors and second conductors, the first conductors being in contact with the first projection electrodes, the second conductors being in contact with the second projection electrodes.*

*41. The storage system according to claim 38, wherein at least one of the dummy electrodes further includes a third pad for burying a vacant region, and no projection-electrode is formed on the third pad.*

*42. The storage system according to claim 38, wherein the central region in which the signal electrodes are formed has a width about ⅓ to ½ of an entire width of the array.*

*43. The storage system according to claim 38, wherein a proportion in number of the signal electrodes to the electrodes is less than 20%.*

*44. The storage system according to claim 38, wherein the signal electrodes are placed to exhibit line symmetry about a center line of the array formed by the electrodes or point symmetry about a center of the array.*

*45. The storage system according to claim 38, wherein the dummy electrodes are arrayed to at least one side of an entire circumference of the signal electrodes.*

*46. The storage system according to claim 38, wherein the semiconductor chips are stacked and encapsulated in the resin encapsulation.*

*47. The storage system according to claim 46, wherein*

*a plurality of bonding wires are encapsulated in the resin encapsulation,*

*the bonding wires are electrically connected to the semiconductor chips and the first substrate,*

*the bonding wires extending from the semiconductor chips are connected to a wiring pattern at an end of the first substrate, and*

*the semiconductor chips are stacked in a slightly deviating manner in the resin encapsulation.*

*48. The storage system according to claim 47, wherein*

*the semiconductor chips are stacked to be deviated by a predetermined amount such that top surfaces of peripheries of the semiconductor chips to which the bonding wires are connected are not overlapped by another one of the semiconductor chips, and*

*one of the bonding wires is connected to one side of each of the semiconductor chips.*

*49. The storage system according to claim 38, wherein at least one of the semiconductor chips has a NAND flash memory incorporated therein.*

*50. The storage system according to claim 38, further comprising*

*a controller mounted on the second substrate, and*

*a power supply circuit mounted on the second substrate, wherein*

*the plurality of semiconductor chips include a first semiconductor chip and a second semiconductor chip, the first semiconductor chip and the second semiconductor chip are partially overlapped, and a peripheral portion of the second semiconductor chip is not overlapped on one side of the first semiconductor chip.*

*51. The storage system according to claim 38, wherein*

*the semiconductor package is 14×18 mm in outer dimension, and*

*the semiconductor package is a maximum of 1.46 millimeters in height from the second substrate.*

*52. The storage system according to claim 38, wherein*

*the electrodes form a line in a long-side direction of the array and a line in a short-side direction of the array, and*

*the electrodes are arrayed in an approximate rectangular shape that has a center matching that of the first substrate.*

*53. The storage system according to claim 38, wherein*

*the central region has a width about ⅓ of an entire width in a long-side direction of the array,*

*the signal electrodes and a subset of the dummy electrodes are in the central region, and*

*the remaining dummy electrodes are spread out in the outer region in at least one long-side direction from the central region.*

*54. The storage system according to claim 38, wherein*

*the outer region is located on both sides of the central region, and*

*the dummy electrodes are formed in an array to almost occupy at least one of the sides of the outer region.*

*55. The storage system according to claim 38, wherein*

*the dummy electrodes are formed in two lines in a short-side direction of the array on the outer region, and*

*each of the lines includes at least three projection-electrodes.*

*56. The storage system according to claim 55, wherein*

*Vcc electrodes in the central region are formed in a Vcc electrode line in the short-side direction of the array, and*

*the Vcc electrode line is next to the two dummy electrode lines.*

*57. The storage system according to claim 38, further comprising:*

*bonding pads arranged on a short side of the first substrate, and*

*through holes in the first substrate that are connected by patterns on the first substrate.*

*58. The storage system according to claim 38, wherein the first pads are electrically connected to at least one of the semiconductor chips by a through hole and a pattern on the first substrate.*

*59. The storage system according to claim 38, wherein*

*the signal electrodes include a Vcc electrode,*

*three dummy electrodes are formed in the outer region, and*

*the Vcc electrode and the three dummy electrodes form a line in a long-side direction of the array.*

*60. The storage system according to claim 38, further comprising a controller,*

*wherein the controller controls at least one of the semiconductor chips in the semiconductor package, the at least one of the semiconductor chips includes a NAND flash memory.*

*61. The storage system according to claim 60, further comprising a volatile memory mounted on the second substrate.*

*62. The storage system according to claim 61, wherein the volatile memory is Dynamic Random Access Memory.*

*63. The storage system according to claim 61, wherein a power supply circuit is incorporated in a second semiconductor package.*

*64. The storage system according to claim 63, wherein an underfill agent is filled between the second substrate and the second semiconductor package.*

*65. The storage system according to claim 60, further comprising third semiconductor packages mounted on the second substrate, the third semiconductor packages including NAND flash memories.*

*66. The storage system according to claim 65, wherein the number of the third semiconductor packages is four or more.*

*67. The storage system according to claim 65, wherein a plurality of semiconductor chips are stacked in each of the third semiconductor packages.*

*68. The storage system according to claim 38, wherein a connector is arranged at an outer periphery of the second substrate.*

*69. The storage system according to claim 38, wherein at least one of the semiconductor chips includes a plurality of memory cells, the memory cells being capable of multiple-valued recording.*

*70. The storage system according to claim 38, wherein the central region in which the signal electrodes are formed has a region of a width about ⅓ to ½ of an entire width of the array.*

*71. The storage system according to claim 38, wherein an outer dimension of the second substrate is substantially the same in size as that of a 1.8-inch HDD according to the HDD standard.*

*72. A storage system comprising:*

*a mounting substrate; and*

*a plurality of semiconductor packages mounted on the mounting substrate;*

*wherein*

*at least one of the semiconductor packages includes:*

*a plurality of semiconductor chips;*

*a wiring substrate on which the plurality of semiconductor chips are mounted on a first surface; and*

*a plurality of projection electrodes formed on a second surface opposite to the first surface of the wiring substrate, wherein*

*a plurality of projection-electrode forming pads for forming the projection electrodes are arrayed on the second surface,*

*the projection-electrode forming pads include first projection-electrode forming pads as projection-electrode forming pads formed within a central region of the array for at least a power supply line and second projection-electrode forming pads as projection-electrode forming pads for a dummy electrode formed on an outer region outside of the central region,*

*a proportion of a number of the first projection-electrode forming pads in the central region to a total number of the first and second projection-electrode forming pads is 10-30 percent,*

*the projection electrodes include first projection electrodes formed on the first projection-electrode forming pads and second projection electrodes formed on the second projection-electrode forming pads.*

*73. The storage system according to claim 72, wherein*

*the outer region includes a first region and a second region, the first region including the dummy electrodes surrounding the central region and including four corners, the second region including one or more lines of the dummy electrodes formed outside of the four corners of the first region.*

*74. The storage system according to claim 72, wherein the mounting substrate includes a plurality of conductors, the plurality of conductors including first conductors and second conductors, the first conductors being in contact with the first projection electrodes, the second conductors being in contact with the second projection electrodes.*

*75. The storage system according to claim 72, further comprising*

*a power supply circuit mounted on the mounting substrate; and*

*a controller mounted on the mounting substrate, wherein*

*the plurality of semiconductor chips include a first semiconductor chip and a second semiconductor chip, the first semiconductor chip and the second semiconductor chip are partially overlapped, and a peripheral portion of the second semiconductor chip is not overlapped on one side of the first semiconductor chip, and*

*a bonding pad, to which a bonding wire extending from at least one of the semiconductor chips is connected, is formed at an edge of the first surface of the wiring substrate.*

*76. The storage system according to claim 72, wherein the central region in which the signal electrodes are formed has a region of a width about ⅓ to ½ of an entire width of the array.*

*77. The storage system according to claim 72, wherein an outer dimension of the mounting substrate is substantially the same in size as that of a 1.8-inch HDD according to the HDD standard.*

*78. A storage device comprising:*

*a substrate, and*

*a semiconductor package including a semiconductor chip and an array of electrodes on a bottom surface of the semiconductor package, the semiconductor package being mounted on the substrate, the electrodes including a plurality of signal electrodes formed within a central region of the bottom surface of the semiconductor package, and a plurality of dummy electrodes formed on an outer region outside of the central region,*

*wherein a proportion of a number of the signal electrodes to a total number of the plurality of electrodes is 10-30 percent.*

*79. The storage device according to claim 78, wherein the central region in which the signal electrodes are formed has a region of a width about ⅓ to ½ of an entire width of the array.*

*80. A storage device comprising:*

*a semiconductor package including a semiconductor chip, a substrate, and an array of electrodes on a bottom surface of the substrate, the semiconductor package being mounted on the substrate; wherein*

*the electrodes include a plurality of dummy electrodes formed in a rectangular outer region and a plurality of signal electrodes formed within a substantially square central region disposed within the outer region, and the substantially square central region being rotated by 45 degrees with respect to the rectangular outer region,*

*the signal electrodes include a first projection electrode, and*

*the dummy electrodes include a second projection electrode.*

*81. The storage device according to claim 80, wherein a proportion of a number of the signal electrodes to a total number of the plurality of electrodes is 10-30%.*

*82. The storage device according to claim 81, wherein a proportion in number of the signal electrodes to the electrodes is less than 20%.*

*83. The storage device according to claim 80, wherein the central region in which the signal electrodes are formed has a region of a width about ⅓ to ½ of an entire width of the array.*

*84. A storage device comprising:*

*a substrate, and*

*a semiconductor package including a semiconductor chip and an array of electrodes on a bottom surface of the semiconductor package, the semiconductor package being mounted on the substrate, the electrodes including a plurality of signal electrodes formed within a central region of the bottom surface of the semiconductor package, and a plurality of dummy electrodes formed on an outer region outside of the central region,*

*wherein the central region in which the signal electrodes are formed has a region of a width about ⅓ to ½ of an entire width of the array.*

*85. The storage device according to claim 84, wherein all of the of signal electrodes are formed within the central region.*

* * * * *